United States Patent [19]

Makowiecki et al.

[11] Patent Number: 5,670,252
[45] Date of Patent: Sep. 23, 1997

[54] BORON CONTAINING MULTILAYER COATINGS AND METHOD OF FABRICATION

[75] Inventors: Daniel M. Makowiecki; Alan F. Jankowski, both of Livermore, Calif.

[73] Assignee: Regents of the University of California, Oakland, Calif.

[21] Appl. No.: 334,091

[22] Filed: Nov. 4, 1994

Related U.S. Application Data

[63] Continuation-in-part of Ser. No. 334,090, Nov. 4, 1994, which is a continuation-in-part of Ser. No. 48,373, Apr. 15, 1993, Pat. No. 5,389,445, which is a division of Ser. No. 666,971, Mar. 11, 1991, Pat. No. 5,203,977.

[51] Int. Cl.$^6$ .............................. B32B 18/00; C23C 14/35
[52] U.S. Cl. .............................. 428/336; 359/584; 359/585; 359/589; 428/688; 428/698; 428/704
[58] Field of Search ................... 428/698, 704, 428/912.2, 336, 688; 359/584, 585, 589

[56] References Cited

U.S. PATENT DOCUMENTS

| | | | |
|---|---|---|---|
| 5,137,772 | 8/1992 | Watanabe | 428/704 |
| 5,203,977 | 4/1993 | Makowiecki | 204/192.15 |
| 5,286,361 | 2/1994 | Makowiecki | 204/289.12 |
| 5,310,603 | 5/1994 | Fukuda | 428/698 |
| 5,333,726 | 8/1994 | Makowiecki | 204/298.09 |
| 5,381,944 | 1/1995 | Makowiecki | 228/124.5 |
| 5,382,342 | 1/1995 | Bionta | 204/192.26 |
| 5,389,445 | 2/1995 | Makowiecki | 428/457 |
| 5,392,981 | 2/1995 | Makowiecki | 228/122.1 |
| 5,433,988 | 7/1995 | Fukuda | 428/698 |

OTHER PUBLICATIONS

SPIE vol. 984, Manufacture, Structure and Performance of W/B$_4$C Multilayer X-Ray Mirrors, A.F. Jankowski et al., pp. 64–74, 1988.
J. Vac. Sci. Technol. A8(6), Magnetron Sputtered Boron Films and Ti/B Multilayer Structures, D.M. Makowiecki et al., pp. 3910–3913, Nov./Dec. 1990.
7th CIMTEC, Densification Studies of Refractory Materials Using Hot Isostatic Pressing (HIP) And Tantalum Containment, C. Hoenig et al., pp. 1337–1345, Jun. 1990.
UCR-JC-106571, "Magnetron Sputter Deposition of Boron and Boron Carbide", M. McKernan et al., Apr. 1991.

*Primary Examiner*—Ellis Robinson
*Assistant Examiner*—Timothy M. Speer
*Attorney, Agent, or Firm*—L. E. Carnahan; Henry P. Sartorio

[57] ABSTRACT

Hard coatings are fabricated from multilayer boron/boron carbide, boron carbide/cubic boron nitride, and boron/boron nitride/boron carbide, and the fabrication thereof involves magnetron sputtering in a selected atmosphere. These hard coatings may be applied to tools and engine and other parts, as well to reduce wear on tribological surfaces and electronic devices. These boron coatings contain no morphological growth features. For example, the boron and boron carbide used in forming the multilayers are formed in an inert (e.g. argon) atmosphere, while the cubic boron nitride is formed in a reactive (e.g. nitrogen) atmosphere. The multilayer boron/boron carbide, and boron carbide/cubic boron nitride is produced by depositing alternate layers of boron, cubic boron nitride or boron carbide, with the alternate layers having a thickness of 1 nanometer to 1 micrometer, and at least the interfaces of the layers may be of a discrete or a blended or graded composition.

34 Claims, 4 Drawing Sheets

BORON CONTAINING MULTILAYER COATINGS AND METHOD OF FABRICATION

RELATED APPLICATIONS

This application is a continuation-in-part of U.S. application Ser. No. 08/334,090, filed Nov. 4, 1994, entitled "Magnetron Sputtered Boron Films", which is a continuation-in-part of U.S. application Ser. No. 08/048,373, filed Apr. 15, 1993, now U.S. Pat. No. 5,389,445 issued Feb. 14, 1995, which is a division of U.S. application Ser. No. 07/666,971, filed Mar. 11, 1991, now U.S. Patent No. 5,203,977 issued Apr. 20, 1993.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is directed to thin films or coatings, particularly to magnetron sputtered thin boron containing hard coatings, and more particularly to multilayer boron/boron carbide, multilayer boron nitride/boron carbide, and multilayer boron/boron nitride/boron carbide, and to the fabrication thereof.

The very stable, hard refractory compounds of boron and carbon are candidate materials for many engineering applications that are subject to erosion, corrosion and high temperatures. Thin films or foils of these materials are often coated on high temperature substrates by chemical vapor deposition (CVD). Coatings of these materials are attractive, for example, as the low Z non-absorbing layer in high Z/low Z multilayer mirrors offering enhanced reflectivity 0.1–10 nm x-rays from grazing normal incidence. However, the performance of multilayer coatings as x-ray optics requires precise control of layer thickness between 2 and 50 nm and chemically unrelated interfaces. This precludes the use of high temperature coating processes such as CVD because of interfacial distortions resulting from interactions between the layers.

Thin foils are also widely used, for example, as band-pass filters, in transmission filters, and in spectroscopic applications which use irradiation wavelengths in the range of extreme ultra-violet to soft x-rays. Submicron foils, 0.1–0.2 µm thick, have been produced in various low Z materials (low atomic number) (i.e. carbon, beryllium) by sputtering and evaporation processes. Also, thin boron films have been previously produced by resistance heating or electron beam evaporation (Labov, S. et al. Applied Optics 24:576 (1985)). Boron carbide ($B_4C$) films have been fabricated by various prior known deposition and evaporation processes. In addition, boron nitride films have been previously prepared by a variety of ion-assisted vapor deposition processes. Previous efforts to prepare boron foils, films, or coatings and multilayers thereof by sputter deposition were precluded by the lack of availability of dense, high purity sputter targets.

Boron sputter targets with sufficient density to allow reproducible control of the sputtering process were not available until recently. Consequently, a process has been developed for fabricating pure dense boron sputter targets using a hot-isostatic press. See Hoenig et al., Proceedings of the Seventh CIMTEC, World Ceramics Congress, Montecatini-Terme, Italy, Jun. 24–28, 1990, published by Elsevier, The Netherlands; and U.S. Pat. No. 5,240,691 issued Aug. 31, 1993 to C. L. Hoenig. In this process pure boron power (99.9%) was vacuum sealed in a tantalum can be electron beam welding and hot isostatically compacted at 1700° C. in argon gas at 0.21 GPa for 2–4 hours. The resulting monolith of pure boron was fabricated into sputtering targets by standard ceramic machining techniques. The boron had an immersion density of 2.34 $gcm^{-3}$ and a porosity less than 0.15%.

Consequently, sputtering processes excellent stability were developed that enabled the production, for example, of multilayer x-ray optics using boron and boron carbide as the transparent low Z layer material. The chemical stability, structureness morphology and low absorption of sputtered films of boron and boron carbide resulted in the fabrication of Ti/B and W/$B_4$C multilayered x-ray optics with good reflectivities. For example, boron films and boron/titanium (B/Ti) multilayers have been produced by a magnetron sputtering method described and claimed in above-referenced U.S. Pat. No. 5,203,977. Also, the availability of high purity dense boron sputter targets has resulted in a recent new fabrication method for cubic-boron nitride films, described and claimed in copending U.S. application Ser. No. 08/334,099, filed Nov. 4, 1994, entitled "Boron Containing Coatings And Method Of Fabrication", assigned to the same assignee.

Utilizing this magnetron sputtering method, for example, boron films approximately 7 µm thick were deposited on a variety of substrates (i.e. fused silicon, sapphire and silicon) by rf. magnetron sputtering at 400 W in argon at 2.1 Pa.

In addition, boron carbide sputter targets were fabricated from fully dense, high purity (99.9%) material acquired from various commercial sources. High deposition rates and current densities required the use of a laminated target design to prevent catastrophic failure of the boron carbide targets because of the thermal stress created by large temperature gradients on the target surface resulting from the non-uniform ion bombardment associated with magnetron sputtering sources. Such a target design consisted of two boron carbide discs 6.35 cm in diameter and approximately 0.6 cm thick brazed together with a 1 mm aluminum shim at 300° C. This laminated design enabled normal sputter deposition at powers above 1 KW where thermal-stress-reduced fractures routinely occurred. Boron carbide films over 50 µm thick were deposited on room temperature substrates by dc magnetron sputtering at 1200 W in argon at 2.0 Pa. For greater details of the laminated boron carbide target, and for further information relative to the fabrication and testing of magnetron sputtered boron and boron carbide films, see Surface and Coatings Technology, 49 (1991), 411–415, "Magnetron Sputter Deposition Of Boron And Boron Carbide", M. A. McKernan et al.

Boron nitride films and boron/cubic boron nitride multi-layers have now been produced by a magnetron sputtering method described and claimed in above-referenced copending U.S. application Ser. No. 08/334,099). The boron or boron nitride films can be produced using a single pure boron target and either an inert (for boron) or a reactive (for boron nitride) atmosphere, and thus multilayers of these materials can be readily produced.

Typically, sputtered boron containing films (boron, boron nitride, boron carbide) exhibit superior mechanical properties. In addition, they have fewer defects and finer morphological growth features than films prepared by evaporative processes. The mechanic properties of these materials (B, BN, and $B_4$C) are compatible in application and in fabrication, and thus multilayers of any two or more of these materials can be readily fabricated using the magnetron sputtering process.

Multilayered coatings, which are used, for example, as reflective layers in x-ray optics, as pointed out above, are typically tens to hundreds of angstroms thick. A multilayer x-ray mirror is the analog of a quarter-wave stack reflective coating with the added complication of radiation absorption in the layers. Physically, it is an alternating sequence of thin films of highly absorbing and less absorbing materials deposited on an optically smooth substrate. The layered structure is periodic and results in a large angle, resonant reflectivity which is three or four orders of magnitude greater than the simple Fresnel reflection from an unlayered surface. Reflectivity in a multilayer mirror derives from the interference of x-rays coherently scattered from the interfaces between materials of higher or lower x-ray absorption.

The quality of the multilayered optical coating is determined by the perfection of the interfaces between the layers and the uniformity of the layer dimensions. Standard methods for application of multilayer coatings use the physical vapor deposition (PVD) process of evaporation or sputtering.

The coarse layer microstructure produced and the inherent difficulty in controlling the evaporation processes adversely effects the interface perfection and layer dimensional stability, and consequently, the efficiency of the optical coating produced by such methods. The use of computer controlled sputtering processes, such as rf magnetron sputtering process, allows the production of complex multilayer coatings with variable layer thickness and composition. A method for forming multilayer structures using an rf magnetron process is described and claimed in above-referenced U.S. Pat. No. 5,203,977, and titanium/boron (Ti/B) multilayers are described and claimed in above-referenced, copending U.S. application Ser. No. 08/048,373, filed Apr. 15, 1993, entitled "Magnetron Sputtered Boron Films And Ti/B Multilayer Structures", now U.S. Pat. No. 5,389,445 issued Feb. 14, 1995.

With the advent of the magnetron sputtering deposition process and the development of high density, crystalline boron targets, it has been found that amorphous boron films which have no morphological growth features can be produced using the method of above-referenced U.S. Pat. No. 5,203,977. Such are described and claimed in copending U.S. application Ser. No. 08/334,090, filed Nov. 4, 1994, entitled "Magnetron Sputtered Boron Films". In addition, as pointed out above, it has been found that boron nitride and cubic boron nitride films or coatings can be produced by a process similar to that used in producing the boron films by utilizing the high purity boron target and a different environment or atmosphere during deposition. Also, by alternating the gas composition in the sputtering process multilayers containing boron or cubic boron nitride can be produced using a single boron target magnetron sputtering process. In addition, it has been found that multilayers of boron/boron carbide and cubic boron nitride/boron carbide can be produced by magnetron sputtering, but using dc sputtering of a boron carbide target and rf sputtering of a boron target. Thus, these films or coating, may be utilized effectively in various electronic components, as well as providing hard surface coatings for tools, machinery equipment, and engine components, etc. Therefore, by the discovery of a sputtering process for producing boron, cubic boron nitride, boron carbide, and/or multilayers of these materials, prior problems have been addressed, especially stress, and needs particularly for hard coatings, have been provided by this invention, thus greatly advancing the state of the art.

SUMMARY OF THE INVENTION

It is an object of the present invention to provide thin films or coatings containing boron.

A further object of the invention is to provide a method for producing boron containing films.

A further object of the invention is to provide stress free films or coatings composed of a multilayer boron/boron carbide, cubic boron nitride/boron carbide, or boron/boron nitride/boron carbide, and wherein the various layers may be, if desired, partially diffused or blended.

A further object of the invention is to provide thin films containing boron which have high hardness, high thermal conductivity, high dielectric constant, and good chemical stability.

Another object of the invention is to provide a multilayer hard coating comprising a plurality of different boron containing layers which have compatible mechanical characteristics and atomic structure.

Another object of the invention is to provide a magnetron sputtering process whereby either boron, cubic boron nitride and/or boron carbide may be produced by changing the deposition environment and/or from rf to dc sputtering.

Another object of the invention is to provide hard coatings on surfaces which coatings are composed of boron/boron carbide or cubic boron nitride/boron carbide multilayers.

Other objects and advantages of the present invention will become apparent from the following description and accompanying drawings. The invention involves the production of multilayers containing thin boron, cubic boron nitride, or boron carbide films or coatings. The boron containing multilayers may be deposited as hard coatings on surfaces, such as tools for machining hardened ferrous materials, on engine parts, etc. or utilized in various electronic components. By alternating the formation of boron films or cubic boron nitride and boron carbide films, a multilayer boron/boron carbide, cubic boron nitride/boron carbide or a boron/cubic boron nitride/boron carbide film or coating may be produced and the various layers of the multilayer may be diffused, blended, or graded to contain from 0 to 100% boron or cubic boron nitride or boron carbide, and the interfaces of the layers may be discrete or diffused. Reduction of stress in multilayers is accomplished due to the compatibility of B, BN and $B_4C$, i.e, the similar mechanical properties, especially thermal expansion coefficients. It is this same material compatibility and atomic structure that allows the fabrication of laminated $B_4C/B_4C$ and $B/B_4C$ sputter targets.

A foil is a very thin sheet of metal, which is usually not thicker than 0.15 mm. A thin film is a material which may be on a substrate or desired surface, with a thickness not greater than 10 µm and uniformity within 20% of its average value. In the instant application, the terms thin film of metal, or thin film and the term foil will be used interchangeably to represent one layer of a particular metal which may be selected from a range of metal thickness. The term coating as used herein defines a layer (film) or multilayer deposited on a surface. In the instant application, low Z refers to metals with an atomic number of 20 or less, and high Z refers to any of a group of metals with an atomic number greater than 20, which includes transition metals, refractory metals and noble metals.

As set forth above, stability of the amorphous sputter-deposited boron, cubic boron nitride or boron carbide suffices for the formation of layered structures even in binary systems, such as the reactive and energetic Ti-B binary system, as described and claimed in above-referenced co-pending application Ser. No. 08/048,373. With the use of these thin boron layers or cubic boron nitride as the non-absorbing low Z (low atomic number) layer in high Z/low Z multilayer structures, such as mirrors, it is possible to further reduce the absorption of such mirrors below that which is attainable with other low Z layers, such as carbon or boron carbide ($B_4C$) layers. This thin boron containing layer fabrication technique is applicable to production of multilayer mirrors for use with a wide range of optical wavelengths.

The fabrication of boron containing foils, films and multilayered structures has, as set forth above not been previously possible until the development of dense, high purity boron to serve as targets for sputter deposition. With this high density target material now available, it is possible to adequately control the magnetron sputtering process so that uniform thin amorphous boron, boron nitride, cubic boron nitride, and boron carbide foils, films and multilayer structures, can be produced.

Cubic boron nitride (c-BN) is similar in structure to diamond and it shares many of its physical properties, such as high thermal conductivity, high hardness, and good chemical stability. Thin films of c-BN are potentially useful as hard coatings, as a protective insulator on semiconductors, for optical surfaces in severe environments, and for semiconductor devices operating at high temperatures. The method for producing c-BN films involves the reactive sputter deposition of the base metal (pure boron) with a reactive gas. The advantage of this processing technique is the ability to control film stress through manipulation of the deposition gas pressure and flow. To produce c-BN by reactive sputter deposition requires high purity, dense boron target materials, and successful radio-frequency (rf) magnetron sputtering of pure boron has been demonstrated, as exemplified by above-referenced U.S. Pat. No. 5,203,977, and it has been found that by utilizing such a pure, dense boron target in a reactive atmosphere, such as nitrogen gas ($N_2$), ammonia, and mixture of argon and nitrogen gas, c-BN films can be produced by reactive sputter deposition.

As set forth above, boron carbide ($B_4C$) films have been produced by dc sputtering of a boron carbide target. Thus, by changing or varying the sputtering gas or atmosphere and/or by changing the source being sputtered by either rf or dc sputtering techniques, various multilayers of different boron containing materials may be produced.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
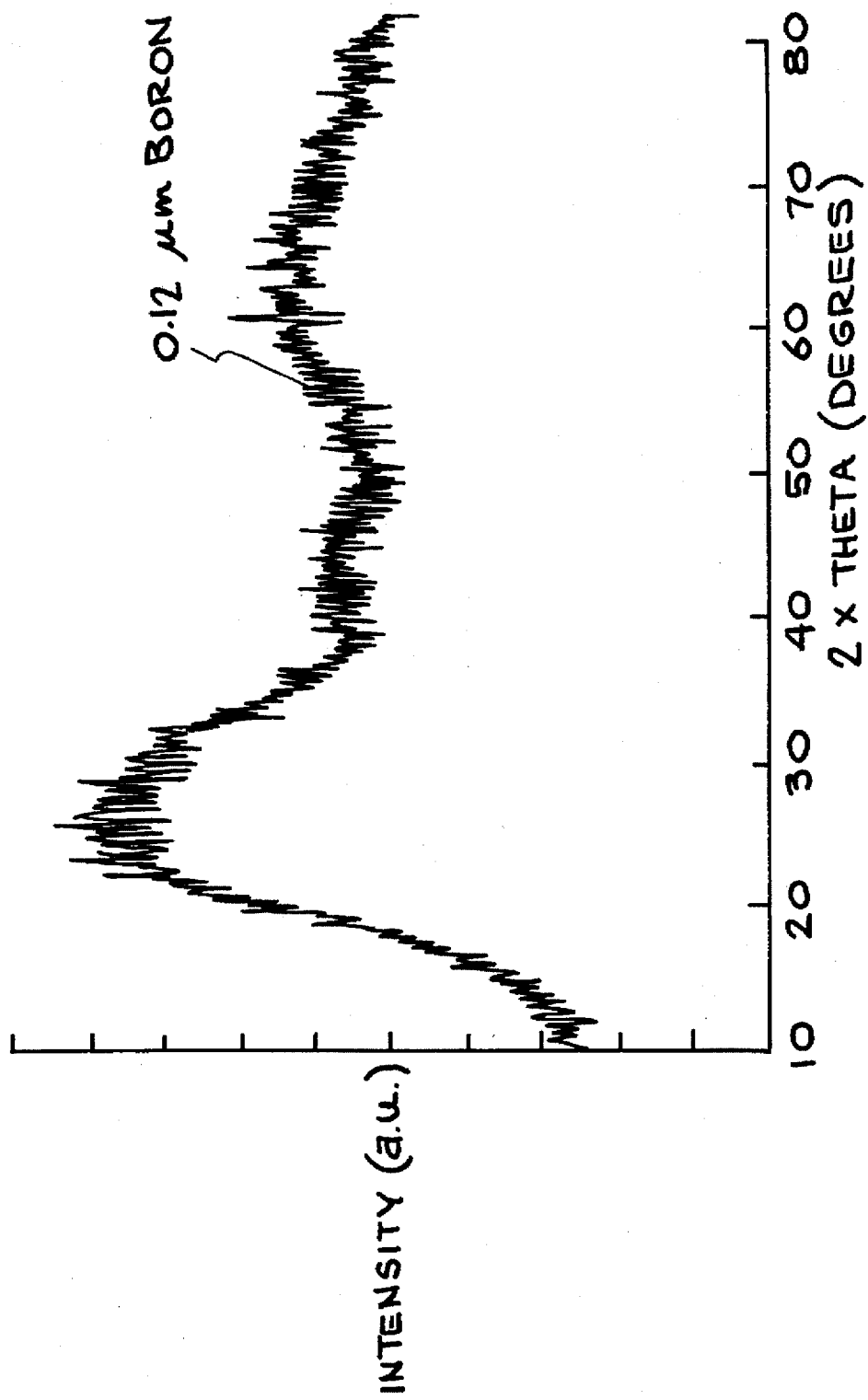
FIG. 1 is an x-ray diffraction scan (CuKα high angle θ/2 θ scan) of a 0.12 μm thick sputter deposited boron foil which lacks any evidence of crystallinity.
Figure 2:
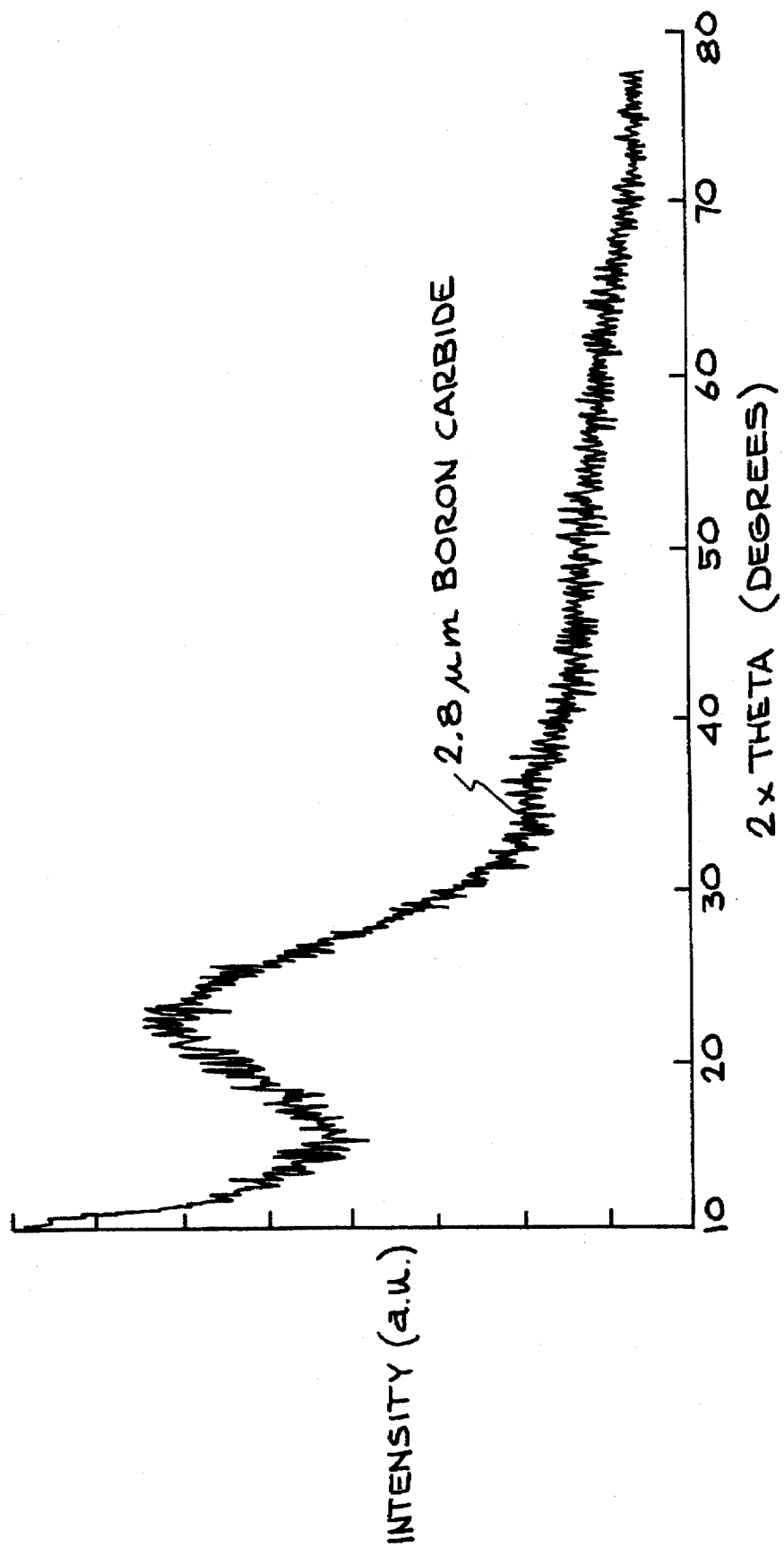
FIG. 2 is an x-ray diffraction scan (similar to FIG. 1) of a 2.8 μm thick boron carbide film.
Figure 3A:
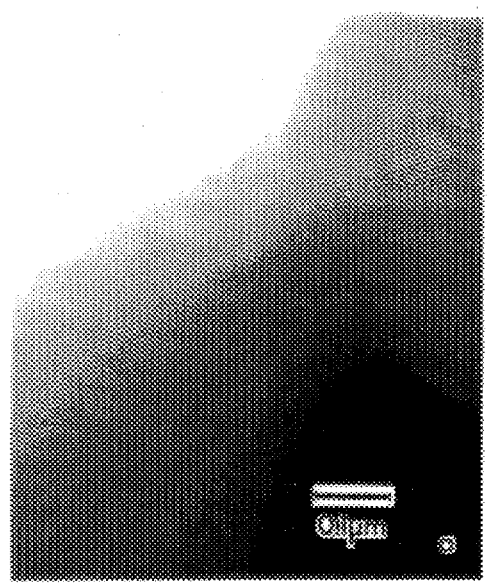
FIGS. 3a and 3b are transmission electron microscopy (TEM) images of 0.12 μm thick boron foil which shows lack of any growth morphology (e.g. columnar grains) or crystallinity in bright field (FIG. 3a) or dark field (FIG. 3b) images.
Figure 3B:
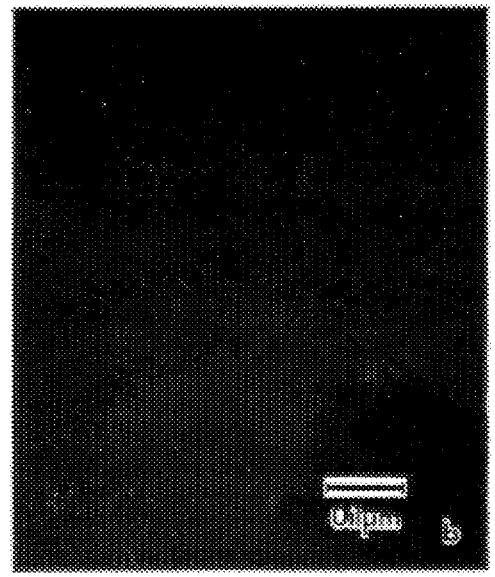
Figure 4A:
FIGS. 4a and 4b are scanning electron microscopy (SEM) micrographs of a fractured boron film 6.8 μm thick (FIG. 4a), and a fractured boron carbide film 2.8 μm thick (FIG. 4b).
Figure 4B:
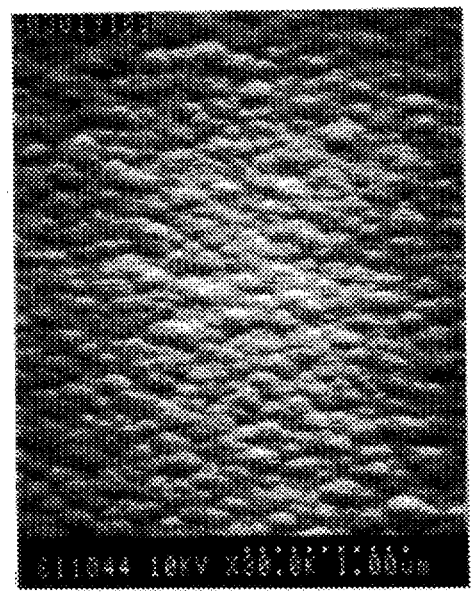

The invention is directed to the formation of multilayer structures from thin, amorphous boron, cubic boron nitride, and boron carbide and to methods for fabricating films boron/boron carbide multilayers and boron carbide/cubic boron nitride multilayers, or multilayers containing various combinations of B, BN and $B_4C$. Quality thin films of boron and cubic boron nitride are produced by an rf magnetron sputtering process which uses pure dense boron sputtering targets, particularly high density, crystalline boron sputtering targets, which are available through a hot isostatic pressing technique. Quality thin films of boron carbide are produced by a dc magnetron sputtering process which uses a laminated boron carbide target fabricated from fully dense, high purity (99.9%) material. The sputtering occurs by the attraction of ions created by electrons trapped in the magnetic field of the magnetron sputter source to the dense target material. Multilayer structures of boron (B) and cubic boron nitride (c-BN) can be fabricated from a single boron sputter source by varying the atmosphere or composition of the sputter gas from pure argon (or other inert gases) to pure nitrogen (or other reactive gases). Multilayer structures may also be fabricated from various materials in combination with thin boron or cubic boron nitride or boron carbide layers, by the use of multisource magnetron sputter system. In certain multilayer applications, mounted low Z and high Z targets undergo rotation during the sputter deposition process to ensure development of uniform layers.

The crystalline phases of boron nitride (i-BN) are analogous to those of carbon while cubic boron nitride (c-BN) is similar in structure to diamond. Cubic boron nitride shares many of the diamond properties including: high thermal conductivity, hardness, high dielectric constant, and good chemical stability. Cubic boron nitride is unusual in that it has a wider band gap than any III-V or IV semiconductor, and it can be P or N doped. Thin films of c-BN, like boron and boron carbide films, are potentially useful as hard coatings for tribological applications and cutting tools, as a protective insulator on semiconductors, for optical surfaces in severe environments, and for semiconductor devices operating at high temperatures. Thus, multilayer structures of these materials also find application in various fields of technology.

As pointed out above, the formation of boron and cubic boron nitride films by rf magnetron sputtering was not carried out until recently when high purity, usable boron sputtering targets became available. The deposition of boron films using these targets is described in several publications, including: M. McKernan et al., "Magnetron Sputter Deposition of Boron and Boron Carbide", Surface and Coatings Technology, 49 (1991) 411–415, referenced above; and D. M. Makowiecki et al., "Magnetron Sputtered Boron Films and Ti/B Multilayer Structures", J. Vac. Sci. Technol. A, (1990) 3910–3913. The deposition of boron carbide films by dc magnetron sputtering using a laminated boron carbide target is described also in above-referenced Surface and Coating Technology, 49 (1991) 411–415. The availability of boron sputter targets also provided a unique opportunity to vary the concept of preparation of c-BN films by reactively sputtering boron in a partial pressure of $N_2$ or a nitrogen containing gas. Another advantage is the process parameter flexibility inherent in reactive magnetron sputtering which offers potentially greater control over the residual stress that has made the deposition of films containing c-BN impossible for any practical applications. Also, unlike the unstable BN films containing c-BN, films formed using pure boron targets were stable. The boron films had a Vickers hardness value of as high as 4300 which is higher than any reported value for BN films containing c-BN. The hardness testing of c-BN films produced by reactive magnetron sputtering are anticipated to show a Vickers hardness value of greater than 4300. This is because the bulk material properties cubic BN is second only to diamond and considerably harder than boron.

In a manner similar to other refractory nitrides (e.g. TIN), boron nitride (BN) can be produced by rf magnetron sputtering of pure boron targets in a reactive gas, such as pure nitrogen, ammonia, and mixtures of these gases with argon. In addition to gas composition the sputtering process parameters varied include: rf sputtering power, substrate material, substrate temperature, substrate bias, and the total pressure of the sputter gas.

The magnetron sputter deposition process for forming boron and boron nitride (cubic boron nitride) is performed in an evacuated chamber which is cryogenically pumped to a base pressure of about $10^{-5}$–$10^{-6}$ Pa. In the preferred mode, a base pressure of $6.7 \times 10^{-6}$ Pa is selected. To initiate the sputtering process, the atmosphere of the reaction chamber is filled with either an inert or reactive gas, with the inert gas, including but not limited to argon, helium, neon, krypton, and xenon, and the reactive gas including nitrogen ($N_2$), ammonia ($NH_3$), and ammonia-nitrogen-argon ($NH_3$-$N_2$-Ar). In the preferred mode argon gas is used to produce boron films, at a working pressure of about $6.7 \times 10^{-1}$ Pa, and the preferred reactive gas is $N_2$ for producing cubic boron nitride films. The magnetron sputtering source is run in the rf (radio frequency) mode, because the high density boron is an electrical insulator. The substrate or surface, which is to receive the thin film, is held at room temperature or up to 700° C. and is positioned directly above the magnetron sputtering source. The deposition process is similar to that described in Makowiecki, D. M. et al. in J. Vacuum Science Technology A8(6): 3910-3913 (1990), which is incorporated by reference. The B and c-BN multilayer films can be made stress-free.

The recently developed pure dense boron sputtering targets were fabricated by a hot isostatic pressing technique such as that described in the above-referenced Hoenig et al. reference. Briefly, pure boron powder (99.9%) was vacuum sealed in a tantalum can be electron beam welding and then hot isostatically compacted at a temperature of 1700° C. and a pressure of 0.21 GPa argon gas. After removal of the tantalum can, standard ceramic machining techniques were used to fabricate sputtering targets from the monolithic piece of boron. The crystalline boron product has a near theoretical density (2.36 g/cc) and an isotropically uniform microstructure.

Thin boron and boron nitride (cubic boron nitride) films are sputtered onto any of a variety of substrates or surfaces at room temperature. The receiving substrate or surface can be any of a variety of polished metal, quartz, glass, or salt-coated glass substrates, including but not limited to NaCl-coated float glass, as well as tools, machining equipment, parts, etc. NaCl is only one of many alkali or alkali containing metal salts that will work. The film produced has a thickness of less than 10 μm, preferably in the range of 1.0–2.0 μm.

A magnetron sputter deposition process has also been used to fabricate the multilayer structures composed of low Z and high Z layers such as Ti/B multilayer structures described and claimed in above-referenced copending application Ser. No. 08/048,373, now U.S. Pat. No. 5,389,445. This process is similar to that described in Jankowski, A. F. et al. in SPIE Conference Proceedings 984:64-74 (1988), which is incorporated by reference. The deposition apparatus for the low Z/high Z multilayer structures was comprised by a rotating carousel of water-cooled substrates which passed sequentially over an array of sputtering target materials. Water-cooling is utilized because boron reacts with many metals, such as Ti. The magnetron sources were arranged so that each layer deposition would be followed by an alternate layer material. The magnetron sputter guns, with the high Z materials operated in a DC mode using a solid-state power supply, about 1 to 10 KW, and were arranged in a circular array beneath the substrate table. The substrate table was rotated, which provided continuous repeating movement of the substrates over the center of each magnetron gun. Typical rotation frequencies ranged from about 0.001 to 0.02 $sec^{-1}$. The sputter deposition rates were found to vary linearly with the power supplied to the magnetron gun.

Such a deposition apparatus for low Z/high Z multilayers is suitable for sputtering with a variety of high Z target materials including, but not limited to titanium, tin, and various refractory metals, noble metals, or transition metals, interspersed between dense low Z target materials, including, but not limited to, boron, beryllium, carbon, cubic boron nitride, and boron carbide. The sputtering process takes place in an inert and/or reactive gas atmosphere, which could include helium, neon, krypton, xenon and argon, with argon preferred in particular; or in a reactive atmosphere which includes nitrogen gas, ammonia, ammonia-nitrogen-argon and mixtures of nitrogen with argon. Cryogenic pumping was used to maintain the inert gas pressure, for example, in the range of about 2 to $15 \times 10^{-1}$ Pa. The receiving substrate was masked on an oxygen-free substrate table and kept at room temperature. The target to substrate distance was about 2-20 cm. The low Z/high Z multilayer structures produced contained 50-100 layers with a nominal repeat sequence of 7-10 μm.

The low Z/high Z multilayered structures were characterized by several techniques, including x-ray diffraction (XRD), transmission electron microscopy (TEM), and Auger electron spectroscopy (AES).

The layer pair spacings of the low Z/high Z multilayer structures were measured at grazing incidence using a standard powder diffractometer operated in the θ/2 θ mode. Electron diffraction provided complimentary information to that obtained via x-ray diffraction to determine the crystalline state of a thin film.

Atomic concentration profiles of the low Z/high Z multilayers are measured with Auger electron spectroscopy (AES) profiling.

Thin films of cubic boron nitride (c-BN) may be produced with the magnetron sputtering process used to produce the boron films except the sputter gas is reactive rather than inert, and may, for example, contain 5 to 100% nitrogen ($N_2$) gas instead of pure argon (Ar) as in the boron film fabrication.

Using the magnetron sputtering process, boron/cubic boron nitride (B/c-BN), boron/boron carbide (B/$B_4$C), and cubic boron nitride/boron carbide (c-BN/$B_4$C) multilayers may be produced. The multilayer B/c-BN process, for example, is essentially a combination of depositing B and c-BN in alternating layers from 1 nanometer to 1 micrometer thick by alternating the gas and using a single source. The interfaces of the layers can be either discrete or diffuse (blended or graded composition). The various layers may also be essentially B or c-BN, or may be a blend of B and c-BN, depending on the application therefore. Both boron and cubic boron nitride are very hard and ideal for wear surfaces. Both materials are very stressed because of the intrinsic atomic structure thereof. Layering these materials eliminates the stress problem in much the same way as plywood is stronger than the same thickness of solid wood of the same type. The multilayer B/c-BN process is described and claimed in above-referenced copending U.S. application Ser. No. 08/334,099.

Using the magnetron sputtering process, boron/boron carbide (B/$B_4$C) multilayers can be produced, and the process is essentially a combination of depositing B and $B_4C$ in alternating layers from 1 nm to 1 μm thickness. As with other multilayer deposition processes the interfaces of the layers can be either discrete or diffuse, and the layers may be a blend of B and $B_4C$. Layering these materials eliminates stress problems in the individual layers.

Boron carbide ($B_4C$) films are relatively easy to fabricate compared to boron (B) and boron nitride (BN). $B_4C$ can be deposited as a film or foil by direct current (dc) magnetron sputtering a boron carbide target in argon (or other inert gas). Boron carbide targets are cheap and commercially available. While the fabrication of B4C films is known in the art, magnetron sputtering of B/B4C multilayers has not been previously accomplished. These multilayer structures have wide utilization potential because the physical properties of B and $B_4C$ are similar, and thus are compatible in a multilayer.

This invention thus involves the production of very hard multilayer films or coatings of boron (B), cubic boron nitride (c-BN), and boron carbide ($B_4C$) and thus multilayer coatings of boron/boron carbide (B/$B_4C$), and cubic boron nitride/boron carbide (c-BN/$B_4C$) can be fabricated by a process which involves magnetron sputtering. Pure sense boron sputtering targets fabricated by a hot isostatic pressing technique described above are utilized with either an inert gas (e.g. argon) or a reactive gas (e.g. nitrogen) to produce either boron or cubic boron nitride films, and boron carbide sputtering targets described above are utilized with an inert gas (e.g. argon) to produce boron carbide films by alternating these techniques, multilayered boron/boron carbide multilayers, and boron carbide/cubic boron nitride multilayers can be produced, as described in detail in the following examples.

EXAMPLES

1. Formation of Boron Films

A boron (B) film of approximately 0.12 μm to 10 μm thickness, was produced by sputtering boron onto a NaCl-coated float glass substrate at room temperature. The coated glass substrate was prepared by thermally evaporating NaCl onto glass, which was precleaned using a detergent, deionized water and an alcohol rinse, and dried with argon gas. The substrate temperature for the NaCl evaporation was 23° C. The high density crystalline boron target was rf magnetron sputtered at 400 watts in a 1.8–2.1 Pa argon atmosphere. The thin boron film was deposited at a rate of 0.1 nm/sec. when the target to substrate separation was 7 cm. The base pressure of the cryogenically pumped system after heating the interior to 80° C. for several hours was $5.3 \times 10^{-5}$ Pa.

2. Formation of Cubic Boron Nitride Films

A cubic boron nitride (c-BN) film of approximately 0.1–10μm thickness, can be produced by the process of Example 1, except the boron target was rf magnetron sputtered in a 1.8–2.1 Pa nitrogen rich or nitrogen containing atmosphere. The sputter gas for c-BN fabrication contains from 5 to 100% nitrogen ($N_2$) gas, with the remaining gas of the composition being argon.

3. Formation of Boron Carbide Films

Boron carbide films over 50 μm thick were deposited on room temperature substrates by dc magnetron sputtering at 1200 W in argon at 2.0 Pa, as described in greater detail in the above-referenced Surface and Coating Technology article by M. A. McKernan et al., incorporated herein by reference.

4. Formation of Boron/Cubic Boron Nitride Multilayers

Boron/cubic boron nitride (B/c-BN) multilayer films or coatings of approximately 1–10 μm thickness, may be produced by alternately rf magnetron sputtering of a single pure boron target in an argon atmosphere and then in a nitrogen atmosphere. The magnetron sputtering target source is arranged on the apparatus so that the deposition of a boron layer would be immediately followed by deposition of a cubic boron nitride layer.

5. Formation of Boron/Boron Carbide Multilayers

Boron/boron carbide (B/$B_4C$) multilayers 1–10μm thick are produced by rotating a substrate under a B sputter source operating as in Example 1 above and then under a $B_4C$ source operating as in Example 3 above.

6. Formation of Cubic Boron Nitride/Boron Carbide Multilayer

Cubic boron nitride/boron carbide (c-BN/$B_4C$) can be produced by alternating the gas composition as in Example 4 above but using a $B_4C$ target instead of a pure B target, or by moving the substrate under a $B_4C$ sputter source (operating as in Example 3 above with argon gas) and then moving the substrate under a pure B sputter source (operating as in Example 2 above with nitrogen containing gas).

It is also recognized that multilayers using a combination of Examples 1–3 can be produced containing various combinations of B, BN and $B_4C$. For example, three different boron containing layers may be produced either in a sequence of layers of B/BN/$B_4C$ or a mixture of these layers of boron containing materials. This can be accomplished, as pointed out above, by the compatible mechanical characteristics and the atomic structure of these materials. Also, while the above examples utilize cubic boron nitride (c-BN), multilayers utilizing layers other phases of boron nitride (BN) can be combined alone or with boron and/or boron carbide.

It has thus been shown that this invention involves the fabrication of multilayer structures from thin films or coatings of boron, boron nitride, and boron carbide to form multilayer films or coatings of boron/boron carbide, boron nitride/boron carbide, and boron/boron nitride/boron carbide and involves processes which utilizes dc and rf magnetron sputtering, and simply changing the type of sputtering gas. The boron/boron carbide multilayers, are produced in an inert atmosphere, such as argon, helium, neon, krypton, and xenon, with argon being preferred; and the cubic boron nitride/boron carbide multilayers are produced in an alternating reactive and inert atmosphere with reactive gases such as nitrogen, ammonia, ammonia-nitrogen-argon, with nitrogen preferred, or a mixture of nitrogen with argon. The cubic boron nitride/boron carbide multilayers require alternate rf (c-BN) and dc ($B_4C$) magnetron sputtering. The atmosphere may be varied during the processing to produce diffused (blended or graded) layers.

The thus produced multilayer boron/boron carbide, cubic boron nitride/boron carbide, and other combination multilayer films or coatings, may be deposited on substrates, etc. for use in electronic components, or on tool surfaces for machining hard metals, as well as on engine parts to reduce friction and wear. The uniqueness of the invention is the ability to deposit pure boron films, by rf magnetron sputtering a boron target using an inert sputter gas (e.g. argon), the measure of hardness of these films (4300 Vickers); the ability to reactively sputter cubic boron nitride by rf magnetron sputtering a boron target in reactive sputter gas (e.g. nitrogen), or in a mixed inert/reactive sputter gas (e.g. Ar and $N_2$ containing 5–100% $N_2$); and the ability to deposit boron carbide films by dc magnetron sputtering a boron carbide target using an inert sputter gas (e.g. argon). Multilayer coatings of B, BN (c-BN) and $B_4C$ by this process produces a hard coating and provides a unique way of controlling stress in the coatings.

While particular embodiments, process parameters, materials, gases, etc. have been set forth to describe the invention and the process involved, such are not intended to limit the invention. Modifications and changes will become apparent to those skilled in the art, and it is intended that the invention be limited only by the scope of the appended claims.

We claim:

1. A multilayer structure consisting of a material selected from the group consisting of alternating layers of boron and boron carbide, and alternating layers of boron nitride and boron carbide.

2. The multilayer structure of claim 1, wherein the layers of boron nitride consist of cubic boron nitride.

3. The multilayer structure of claim 1, wherein at least one of the interfaces of the alternating layers is discrete.

4. The multilayer structure of claim 1, wherein at least one of the interfaces of the alternating layers is diffused.

5. The multilayer structure of claim 1, wherein at least one of the alternating layers is of a composition which varies in composition from 0–100% boron and 100–0% boron nitride or boron carbide.

6. The multilayer structure of claim 1, additionally including layers of material consisting of alternating layers of boron, boron carbide and boron nitride.

7. The multilayer structure of claim 1, formed by a method comprising:

exposing a first target to a magnetron sputtering source, selected from the group of rf and dc magnetron sources, in a selected atmosphere containing gas selected from the group of inert and reactive gas;

collecting a thin film of material ejected from the first target material;

exposing a second target to a magnetron sputtering source in a selected atmosphere containing gas selected from the group of inert and reactive gas; and collecting a thin film of material ejected from the second target on the thin first material film.

8. The multilayer structure of claim 7, wherein the inert gas is argon, and wherein the reactive gas is nitrogen.

9. The multilayer structure of claim 7, wherein the films of ejected material have a thickness of about 1 nanometer to about 1 micrometer.

10. The multilayer structure of claim 7, wherein gas contained in the first-mentioned atmosphere and the gas contained in the second-mentioned atmosphere may be varied to produce at least diffused interfaces between alternating films of ejected material.

11. The multilayer structure of claim 10, wherein the first-mentioned atmosphere is composed of an inert gas, and the second-mentioned atmosphere is composed of a reactive gas.

12. The multilayer structure of claim 11, wherein the inert gas is argon, and the reactive gas is about 5–100% nitrogen.

13. The method of claim 7, additionally including repeating in an alternating manner the exposure of the targets to a magnetron sputtering source in alternating inert and reactive atmospheres to repeatedly produce alternating films of ejected material to a desired thickness.

14. The multilayer structure of claim 7, wherein the first-mentioned atmosphere is composed of an inert gas, and wherein the deposited thin film is composed of boron.

15. The multilayer structure of claim 14, wherein the second-mentioned atmosphere is composed of an inert gas, and wherein the deposited thin film is composed of boron carbide.

16. The multilayer structure of claim 7, wherein the first-mentioned atmosphere is composed of an inert gas, wherein the deposited thin film is composed of boron carbide, wherein the second-mentioned atmosphere is composed of a reactive gas, and wherein the deposited thin film is composed of cubic boron nitride.

17. The multilayer structure of claim 15, wherein an rf magnetron sputtering source is used with the first-mentioned atmosphere, and a dc magnetron sputtering source is used with the second-mentioned atmosphere, such that the material from the first target is boron, and the material from the second target is boron carbide.

18. The multilayer structure of claim 16, wherein dc magnetron sputtering source is used with the inert gas, and wherein an rf magnetron sputtering source us used with the reactive gas.

19. A multilayer structure consisting of magnetron sputtered alternating layers of at least two materials selected from the group consisting of boron, boron carbide, and cubic boron nitride.

20. The multilayer structure of claim 19, consisting of layers of boron and boron carbide.

21. The multilayer structure of claim 19, consisting of layers of boron carbide and cubic boron nitride.

22. The multilayer structure of claim 19, wherein each of the layers has a thickness in the range of 1 nanometer to 1 micrometer.

23. The multilayer structure of claim 19, additionally including a substrate wherein said layers of boron are formed by exposing a dense boron target to an rf magnetron sputtering source in an inert gas, and collecting a thin film of ejected boron on a substrate or on a layer of boron carbide.

24. The multilayer structure of claim 19, additionally including a substrate wherein said layers of boron carbide are formed by exposing a dense boron carbide target to a dc magnetron sputtering source in an inert gas, and collecting a thin film of ejected boron carbide on a substrate or on a layer of boron or on a layer of cubic boron nitride.

25. The multilayer structure of claim 19, additionally including a substrate wherein said layers of cubic boron nitride are formed by exposing a dense boron target to an rf magnetron sputtering source in a reactive gas, and collecting a thin layer of ejected gas, and collecting a thin layer of ejected cubic boron nitride on a substrate or a layer of boron carbide.

26. The multilayer structure of claim 19, wherein the layers of boron and boron carbide are formed by magnetron sputtering in an inert atmosphere.

27. The multilayer structure of claim 19, wherein the layers of cubic boron carbide are formed by magnetron sputtering in a reactive atmosphere.

28. The multilayer structure of claim 19, wherein the layers of boron and cubic boron nitride are formed by an rf magnetron sputtering source.

29. The multilayer structure of claim 19, wherein the layers of boron carbide are formed by a dc magnetron sputtering source.

30. A multilayer structure consisting of a plurality of different boron containing layers selected from the group consisting of boron, boron carbide, and cubic boron carbide, and including at least one layer of boron carbide.

31. The multilayer structure of claim 30, additionally including at least one layer of boron, whereby the structure is a boron and boron carbide multilayer.

32. The multilayer structure of claim 30, additionally including at least one layer of cubic boron nitride, whereby the structure is a cubic boron nitride and boron carbide multilayer.

33. A multilayer structure consisting of a plurality of different boron containing layers selected from the group consisting of boron, boron nitride, and boron carbide, each of said boron containing layers having compatible mechanical characteristics and atomic structures.

34. The multilayer structure of claim 33, wherein the plurality of different boron containing layers are alternately located.

* * * * *